(12) United States Patent
Bang et al.

(10) Patent No.: US 7,605,444 B2
(45) Date of Patent: Oct. 20, 2009

(54) FUSE BOX REDUCING DAMAGE CAUSED BY LASER BLOWING AND CROSS TALK

(75) Inventors: Kwang-kyu Bang, Suwon-si (KR); Kun-gu Lee, Seoul (KR); Jeong-kyu Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 188 days.

(21) Appl. No.: 11/637,996

(22) Filed: Dec. 13, 2006

(65) Prior Publication Data

US 2007/0152297 A1 Jul. 5, 2007

(30) Foreign Application Priority Data

Dec. 29, 2005 (KR) .................. 10-2005-0133028

(51) Int. Cl.
*H01L 29/00* (2006.01)

(52) U.S. Cl. .................. 257/529; 257/E23.15

(58) Field of Classification Search .......... 257/529, 257/E23.15; 438/132, 333
See application file for complete search history.

(56) References Cited

U.S. PATENT DOCUMENTS

| | | | |
|---|---|---|---|
| 5,636,172 A | 6/1997 | Prall et al. | |
| 6,375,159 B2 * | 4/2002 | Daubenspeck et al. | 257/529 |
| 6,380,838 B1 * | 4/2002 | Fujii | 337/283 |
| 6,878,614 B2 * | 4/2005 | Sun et al. | 438/601 |
| 7,301,216 B2 * | 11/2007 | Lee et al. | 257/529 |
| 2003/0119227 A1 * | 6/2003 | Bang et al. | 438/132 |
| 2004/0108572 A1 * | 6/2004 | Kang et al. | 257/529 |

FOREIGN PATENT DOCUMENTS

| | | |
|---|---|---|
| JP | 2003-142582 | 5/2003 |
| KR | 20000043454 | 7/2000 |

* cited by examiner

*Primary Examiner*—Shouxiang Hu
(74) *Attorney, Agent, or Firm*—Mills & Onello, LLP

(57) ABSTRACT

Provided are a fuse box that simultaneously prevents damage caused by laser blowing and cross talk between the fuses and a method of manufacturing the same. In a fuse box having an open region in which fuses are opened by laser blowing and a bundle region in which fuse opens do not occur, a capping layer, adjacent to the open region, having a metal layer and an insulation layer covers the outermost fuses in the bundle region, thereby reducing the influence of laser blowing of fuses in the bundle region, and preventing capacitive coupling caused by the formation of a parasitic capacitor between fuse lines and an insulation layer therebetween. Accordingly, cross talk due to the capacitive coupling can be prevented, thereby enhancing the reliability of a fuse circuit. Lower fuses can be disposed in a lower layer in the bundle region, thereby forming a two-layered fuse box.

10 Claims, 6 Drawing Sheets

FIG. 1 (CONVENTIONAL ART)

PASSIVATION

FUSE BOX REDUCING DAMAGE CAUSED BY LASER BLOWING AND CROSS TALK

CROSS-REFERENCE TO RELATED PATENT APPLICATION

This application claims priority under 35 U.S. C. § 119 from commonly owned Korean Patent Application No. 10-2005-0133028, filed on Dec. 29, 2005, in the Korean Intellectual Property Office, the disclosure of which is incorporated herein in its entirety by reference.

BACKGROUND OF THE INVENTION

1. Field of the Invention

The present invention relates to a semiconductor apparatus, and more particularly, to a fuse box and a method of manufacturing the same.

2. Description of the Related Art

As semiconductor memory devices become more highly integrated and memory capacities thereof increase, the possibility of generating defects in memory cells while manufacturing the semiconductor devices increases, thereby reducing product yields. As a conventional approach to improve the reduction of product yield due to the high integration of semiconductor memory devices, the use of a redundancy circuit is widely used. When a main cell having a defect is detected using a predetermined test, the corresponding fuse in a fuse box is selected and opened so that the defective main cell is substituted with a redundancy cell disposed around the main cell using the redundancy circuit. The fuse is opened using laser blowing. However, in highly integrated semiconductor devices, the fuse size and pitch between fuses are so small that adjacent fuses can be damaged when a fuse is opened in this manner.

Figure 1:
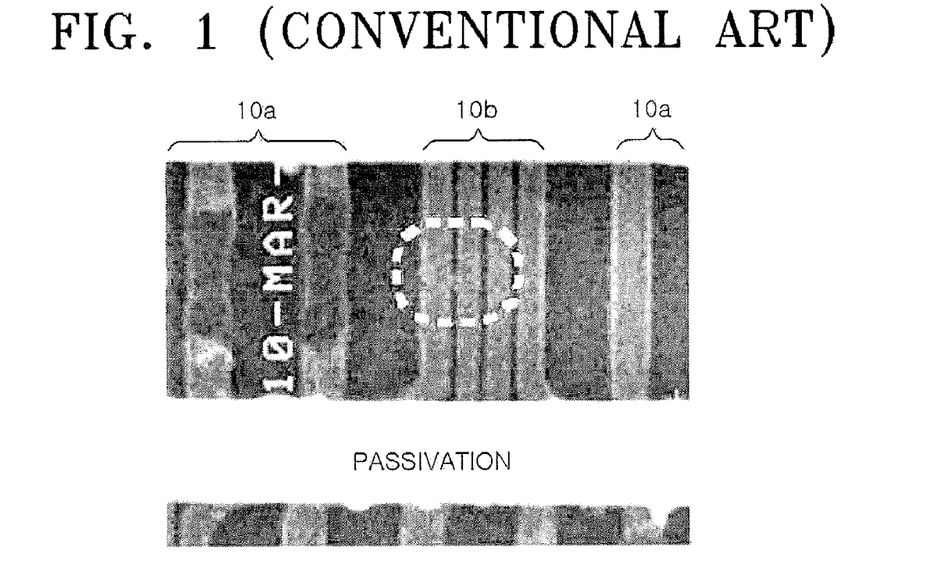
FIG. 1 is an image illustrating a defect in which adjacent fuse lines are bridged when a fuse is opened by performing laser blowing, according to conventional art.

FIG. 1 is an image illustrating a defect in which adjacent fuse lines are bridged when a fuse is opened by performing laser blowing, according to conventional art. In a fuse box, a fuse interval in an open region 10a, in which a fuse is opened by laser blowing, is relatively wide, but the fuse interval in an adjacent bundle region 10b, in which a fuse is not opened, is relatively narrow, thereby increasing the density of the fuses. However, when a fuse is opened by laser blowing, the heat that is generated can melt fuses disposed in the adjacent bundle region 10b, and thus the fuses are bridged, as illustrated in a dotted portion of FIG. 1.

To prevent the influence of heat on adjacent fuses when a fuse is opened, a method of forming a capping layer covering the fuses has been suggested.

Figure 2:
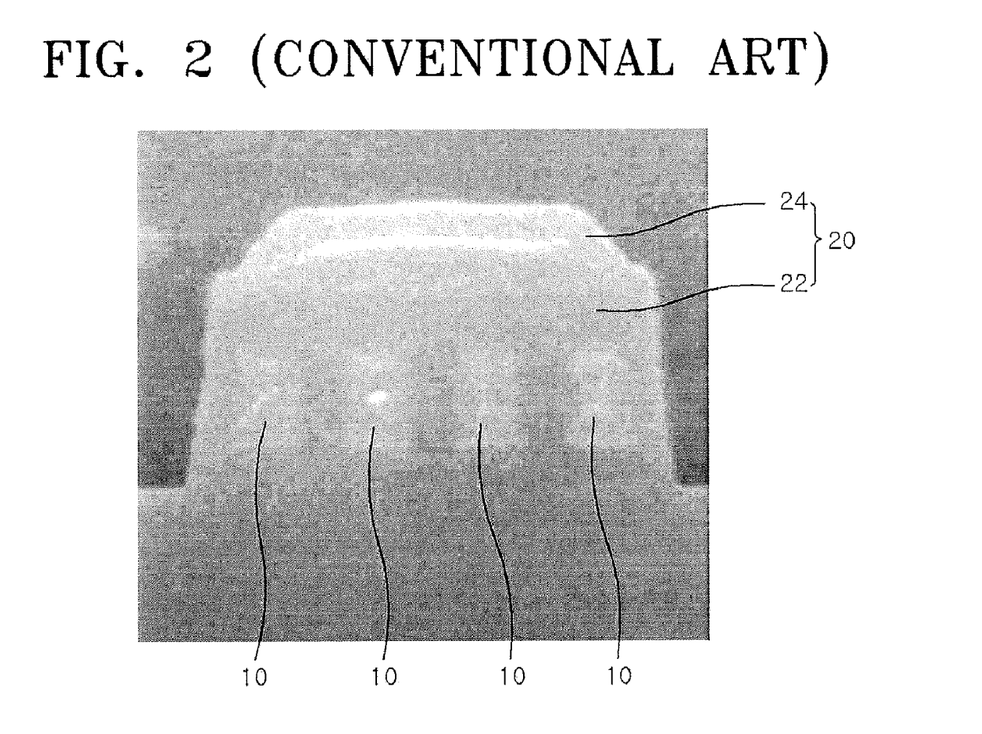
FIG. 2 is an image illustrating a cross-sectional view of fuse lines on which a capping layer is formed, according to conventional art.

FIG. 2 is an image illustrating a cross-sectional view of fuse lines 10 on which a capping layer 20 is formed, according to this conventional art approach. The capping layer 20 includes a metal layer 24 and an insulation layer 22. However, the insulation layer 22 in the capping layer 20 and the fuse lines 10, which are formed of metal, can form a capacitor to generate capacitive cross talk. When the capacitive cross talk is generated, a signal can be irregularly transmitted through the fuses, and thus, a defective cell can not be properly substituted with a redundancy cell.

SUMMARY OF THE INVENTION

In accordance with aspects of the present invention, there is provided a fuse box that simultaneously prevents damage to fuses in a bundle region caused by laser blowing and, thereby, prevents cross talk between the fuses in the bundle region.

In accordance with aspects of the present invention, there is also provided a method of forming a fuse box that simultaneously prevents damage to fuses in a bundle region caused by laser blowing and, thereby, prevents cross talk between the fuses in the bundle region.

According to an aspect of the present invention, there is provided a fuse box including: a first fuse region including a first plurality of fuses; a second fuse region adjacent to the first fuse region, the second fuse region including a second plurality of fuses, wherein a second fuse interval in the second fuse region is narrower than a first fuse interval in the first fuse region; and a capping layer, adjacent to the first fuse region, covering a top side and lateral sides of at least one outermost fuse among the second plurality of fuses in the second fuse region.

In the fuse box, the first plurality of fuses and the second plurality of fuses can be formed of one of Al, Cu, and W.

The capping layer can include at least one insulation layer covering the top side and lateral sides of the at least one outermost fuse in the second fuse region; and at least one metal layer disposed on top of the at least one insulation layer.

The at least one insulation layer can have a low dielectric constant in the range of about 1.5 to 4.5.

The at least one insulation layer can be formed of plasma enhanced tetraethyl orthosilicate (PE-TEOS).

In the fuse box, the first fuse interval can be in the range of about 1.5 to 2.5 μm.

In the fuse box, the second fuse interval can be in the range of about 0.2 to 0.7 μm.

The heights of fuses not covered by the capping layer in the second fuse region can be in the range of about 1500 to 3000 Å, and height of the at least one outermost fuse in the second fuse region that is covered by the capping layer can be in the range of about 4000 to 5000 Å.

The fuse box can further include: a lower fuse pattern disposed in a layer having formed thereupon the first fuse region and the second fuse region.

The lower fuse pattern can be disposed under the second fuse region.

According to another aspect of the present invention, there is provided a method of forming a fuse box, including: on a semiconductor substrate, forming a fuse pattern including a first plurality of fuses in a first fuse region and a second plurality of fuses in a second fuse region adjacent to the first fuse region, wherein a second fuse interval in the second fuse region is narrower than a first fuse interval in the first fuse region; forming a first insulation layer on the fuse pattern; forming a first material layer pattern by forming a first material layer on the first insulation layer and patterning the first material layer adjacent to the first fuse region, covering at least one outermost fuse among the fuses in the second fuse region; forming a second insulation layer on the first material layer pattern; selectively etching the second insulation layer and the first insulation layer to expose the first plurality of fuses in the first fuse region and the second plurality of fuses in the second fuse region that are not covered by the first material layer pattern, thereby forming a capping layer including the first material layer pattern and the first insulation layer pattern covering a top side and lateral sides of the at least one outermost fuse.

The fuse pattern can be formed of a metal layer.

The first insulation layer can be formed of PE-TEOS.

The first material layer can be a metal layer.

In the etching of the first insulation layer and the second insulation layer, fuses from the first plurality of fuses and the second plurality of fuses not covered by the capping layer can be etched to be a predetermined height.

The fuse pattern can be simultaneously formed with a first metal wire pattern.

The first material layer pattern can be simultaneously formed with a second metal wire pattern.

Before the forming of the fuse pattern having the first fuse region and the second fuse region, the method can further include: forming a lower fuse pattern on the semiconductor substrate; and forming an insulation layer on the lower fuse pattern.

The lower fuse pattern can be disposed under the second fuse region.

The lower fuse pattern can be simultaneously formed with a first metal wire pattern.

The fuse pattern having the first fuse region and the second fuse region can be simultaneously formed with a second metal wire pattern.

The first material layer pattern can be formed of a metal layer, and can be simultaneously formed with a third metal wire pattern.

In accordance with yet another aspect of the present invention, provided is a method of forming a fuse box comprising: forming a first metal layer on a semiconductor substrate; patterning the first metal layer to form a fuse pattern which comprises a first plurality of fuses in a first fuse region and a second plurality of fuses in a second fuse region adjacent to the first fuse region, the second plurality of fuses having a second fuse interval that is narrower than a first fuse interval in the first fuse region; forming a first insulation layer on the fuse pattern; forming a second metal layer on the first insulation layer; patterning the second metal layer to form a capping pattern, adjacent to the first fuse region, on the outermost fuses from the second plurality of fuses in the second fuse region; forming a second insulation layer on the capping pattern; etching the second insulation layer and the first insulation layer to expose the first plurality of fuses in the first fuse region and the second plurality of fuses in the second fuse region that are not covered by the capping pattern, to form a protection fuse pattern, adjacent to the first fuse region, wherein the outermost fuses, among the second plurality of fuses in the second fuse region, are covered by the capping pattern and the first insulation layer disposed under the capping pattern.

The fuse pattern can be simultaneously formed with a first metal wire pattern.

The capping pattern can be simultaneously formed with a second metal wire pattern.

BRIEF DESCRIPTION OF THE DRAWINGS

Various aspects of the invention will become more apparent in view of the attached drawing figures, which are provided by way of example, not by way of limitation, in which.

DETAILED DESCRIPTION OF THE INVENTION

Hereinafter, detailed illustrative embodiments of the present invention are disclosed with reference to the accompanying drawings, in which exemplary embodiments of the invention are shown. However, specific structural and functional details disclosed herein are merely representative for purposes of describing such embodiments. The invention can be embodied in many alternate forms and should not be construed as limited to the illustrative embodiments set forth herein.

It will be understood that when an element is referred to as being "on," "connected" or "coupled" to another element, it can be directly on, connected or coupled to the other element or intervening elements can be present. In contrast, when an element is referred to as being "directly on," "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 3:
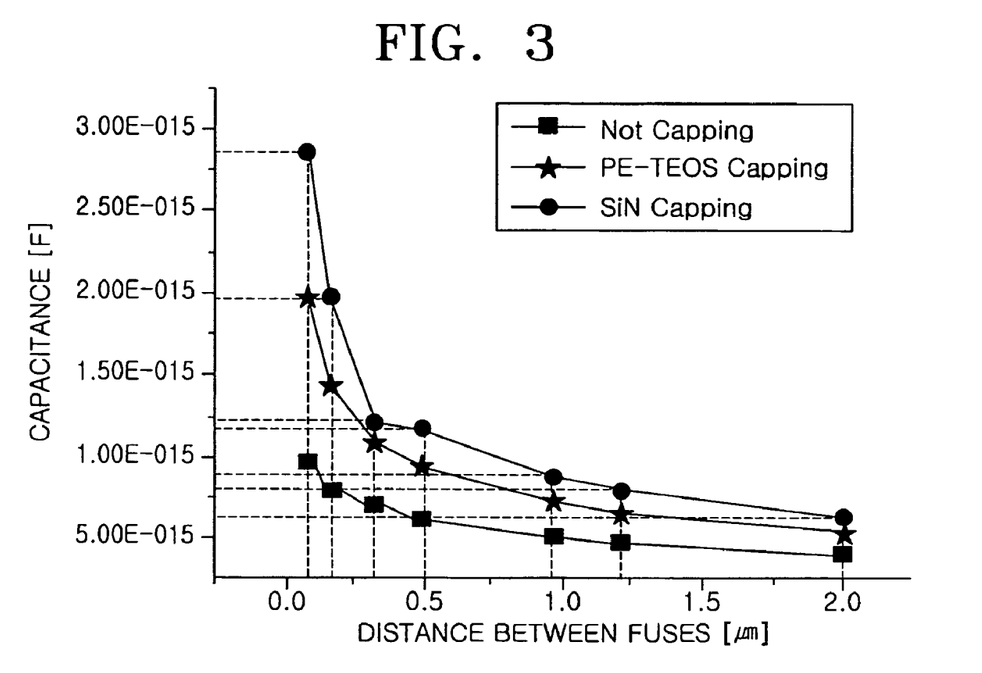
FIG. 3 is a graph of capacitance of a capacitor formed between a fuse pattern versus a distance between fuses in the fuse pattern.

FIG. 3 is a graph of capacitance of a capacitor formed in a fuse pattern versus a distance between fuses in the fuse pattern. In FIG. 3, the line dotted with "■" indicates capacitance when an insulation layer is not formed to cover the fuses and the spaces between the fuses, the line dotted with "★" indicates capacitance when an insulation layer of PE-TEOS is formed to cover the fuses and the spaces between the fuses, and the line dotted with "●" indicates capacitance when an insulation layer of SiN is formed to cover the fuses and the spaces between the fuses.

Referring to FIG. 3, as the distance between the fuses decreases, the capacitance increases for all cases. That is, as the distance between the capacitor electrodes decreases, the capacitance increases. In addition, the capacitance increases in other case, as in the following examples, which are listed in the order of most to least severe: (1) when an insulation layer is not formed to cover the fuses and the spaces between the fuses (■), (2) when an insulation layer of PE-TEOS is formed to cover the fuses, and (3) when the spaces between the fuses (★), and the case when an insulation layer of SiN is formed to cover the fuses and the spaces between the fuses (●). That reflects the dielectric constant increases in the order of air (1), PE-TEOS (3.9), and SiN (7.5).

According to an embodiment of the present disclosure, a fuse box includes an open region having a wide fuse interval, where a fuse is opened by a laser, and an adjacent bundle region having a narrow fuse interval. In the fuse box, a capping layer protecting fuses in the bundle region from laser blowing is formed only on the most adjacent fuses to the open region among the fuses in the bundle region. Accordingly, other fuses in the bundle region are exposed to air, which has the lowest dielectric constant.

Figure 4:
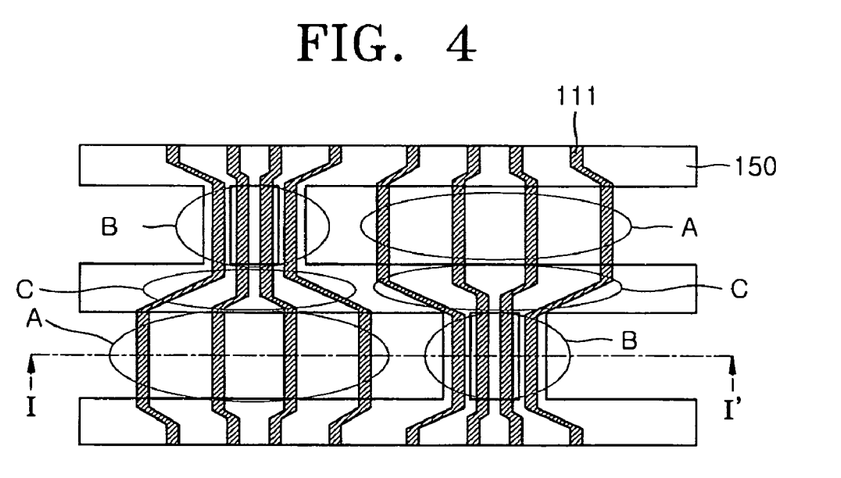
FIG. 4 is a plan view of an embodiment of fuses in a fuse box according to an aspect of the present invention.

FIG. 4 is a plan view of fuses in a fuse box according to an embodiment of the present disclosure. Referring to FIG. 4, the fuse box includes open regions A having a wide fuse interval, bundle regions B having a narrow fuse interval, and a transition region C disposed between the open regions A and the bundle regions B. The open regions A and the bundle regions B are repeatedly and alternately disposed vertically and horizontally. Fuses are opened by laser blowing in the open regions A having a wide fuse interval, and fuses are not opened in the bundle regions B having a narrow fuse interval. A capping layer 150 is formed on outermost fuses 111 in the bundle region B and the fuses in the transition region C.

Figure 5:
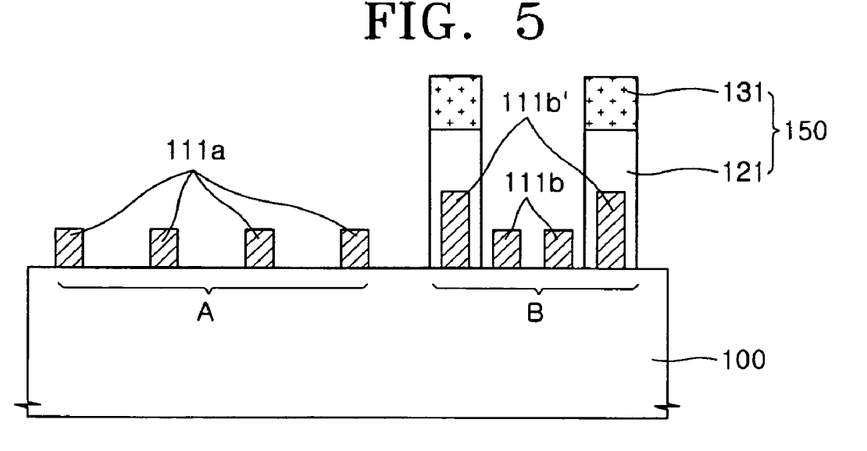
FIG. 5 is a cross-sectional view of the fuse box of FIG. 4 taken along a line I-I'.

FIG. 5 is a cross-sectional view of the fuse box of FIG. 4 taken along a line I-I'. Referring to FIG. 5, fuses in the open region A and the bundle region B are formed on a semiconductor substrate 100. All the fuses in the open region A are exposed to air. Outermost fuses 111b' in the bundle region B are covered by the capping layer 150. The capping layer 150 includes an upper metal layer 131 and an insulation layer 121 disposed under the upper metal layer 131. Except for the outermost fuses 111b' in the bundle region B, other fuses 111a in the open region A and inner fuses 111b in the bundle region B are exposed to air.

When the profile of the top side of the fuses 111a opened by laser blowing is not flat but inclined, laser beams can be reflected toward the bundle region B. When the laser beams are slightly misaligned, the top sides of the fuses 111b and 111b' in the bundle region B can be influenced by the laser beams. However, when a fuse is opened, the laser beams mainly influence the outermost fuses 111b' in the bundle region B, which is adjacent to the open region A. Accordingly, the capping layer 150 can be formed only on the outermost fuses 111b' to sufficiently protect the fuses 111b and 111b' in the bundle region B from laser blowing.

Since the inner fuses 111b in the bundle region B are not covered by the insulation layer, unlike the outermost fuses 111b', a dielectric constant of a parasitic capacitor respectively formed by the inner fuses 111b as electrodes decreases so that the capacitance decreases, thereby reducing capacitive coupling. Accordingly, when a redundancy circuit substitutes a defective main cell with a redundancy cell, the malfunctioning of the redundancy circuit which is caused by fuse signal distortion due to the capacitive coupling between fuses can be prevented. In FIG. 4, the fuse interval in the transition region C is wider than in the bundle regions B, and the fuses in the transition region C covered by the capping layer 150 do not generate cross talk.

FIGS. 6A through 6G illustrate a method of manufacturing a fuse box, according to an embodiment of the present disclosure.

Figure 6A:
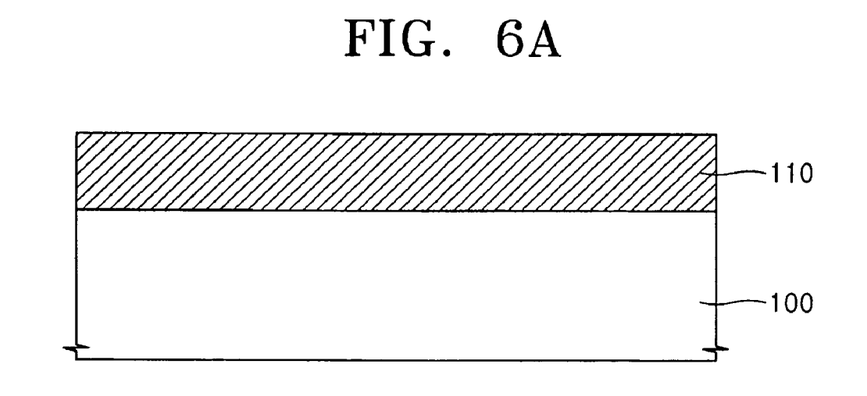
FIGS. 6A through 6G illustrate an embodiment of a method of manufacturing a fuse box, according to another aspect of the present invention.

Referring to FIG. 6A, a first metal layer 110 for forming fuses is formed on a semiconductor substrate 100. The metal layer 110 can be formed of Al, W, or Cu.

Figure 6B:
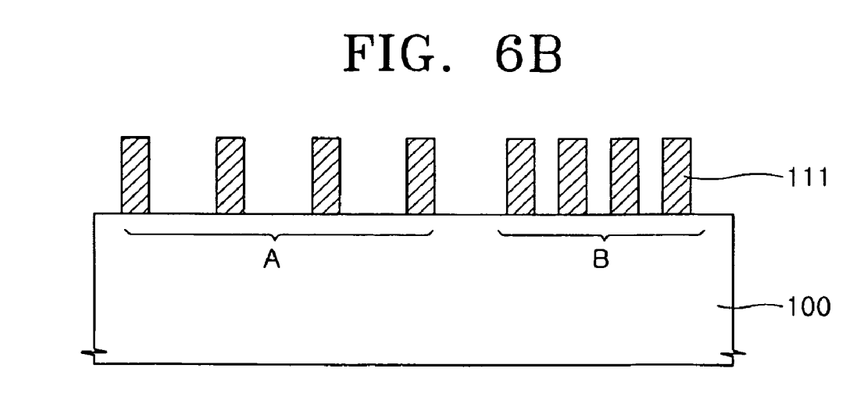

Referring to FIG. 6B, a fuse pattern 111 is formed from the metal layer 110 using a photolithography and etching process. The fuse pattern 111 can be simultaneously formed with a metal wire, in particular, a first metal wire (not illustrated). A fuse box can be formed with a bit line or a gate line disposed in a lower portion of a semiconductor stacking structure, as is known in the art. However, with increased integration, an aspect ratio of an insulation layer to be etched for the opening of the fuse box increases. Therefore, it can be advantageous for the fuse box to be formed in the upper metal wire layer.

As described in FIG. 4, the fuse pattern 111 is patterned so that an open region A, in which the fuse interval is wide, and a bundle region B, in which the fuse interval is narrow, are arranged in parallel. The fuse interval in the open region A can be in a range of about 1.5 to 2.5 µm, and the fuse interval in the bundle region B can be in a range of about 0.2 to 0.7 µm, in the illustrative embodiment.

Figure 6C:
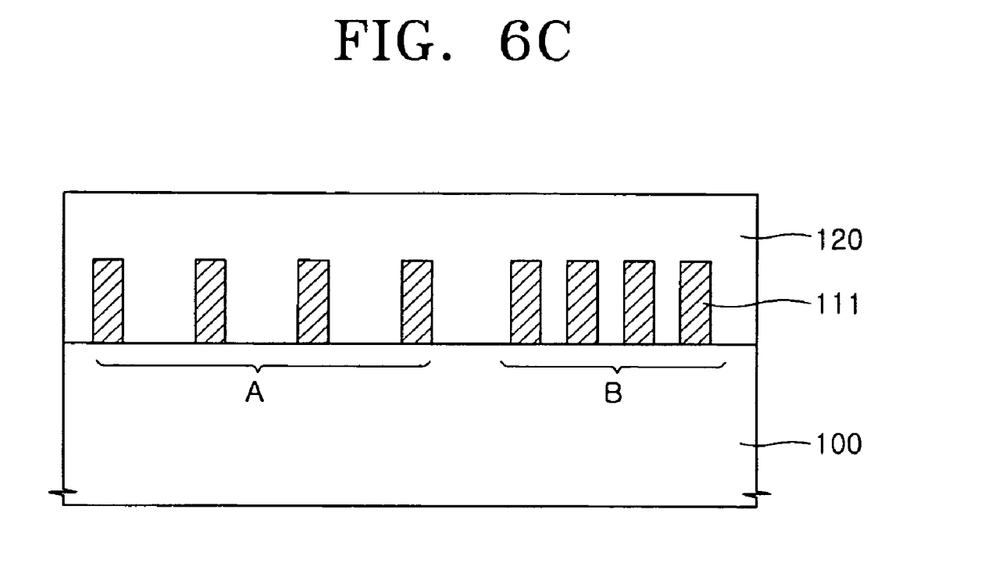

Referring to FIG. 6C, after forming the fuse pattern 111, a first insulation layer 120 covering the fuse pattern 111 is formed. The first insulation layer 120 can be formed of silicon oxide, for example, plasma enhanced tetraethyl orthosilicate (PE-TEOS). The first insulation layer 120 can be a layer having a low dielectric constant in the range of about 1.5 to 4.5.

Figure 6D:
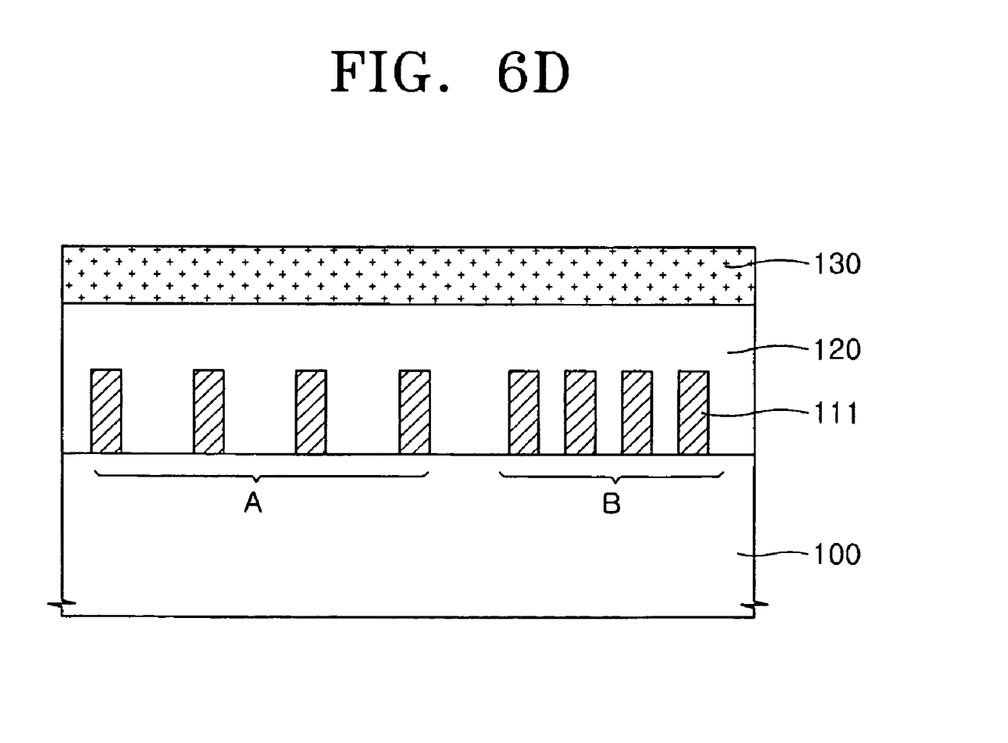

Referring to FIG. 6D, a second metal layer 130 is formed on the first insulation layer 120. The second metal layer 130 is used as a second metal wire and a capping layer for outer fuses 111b' in the bundle region B, which will be described herein below.

Figure 6E:
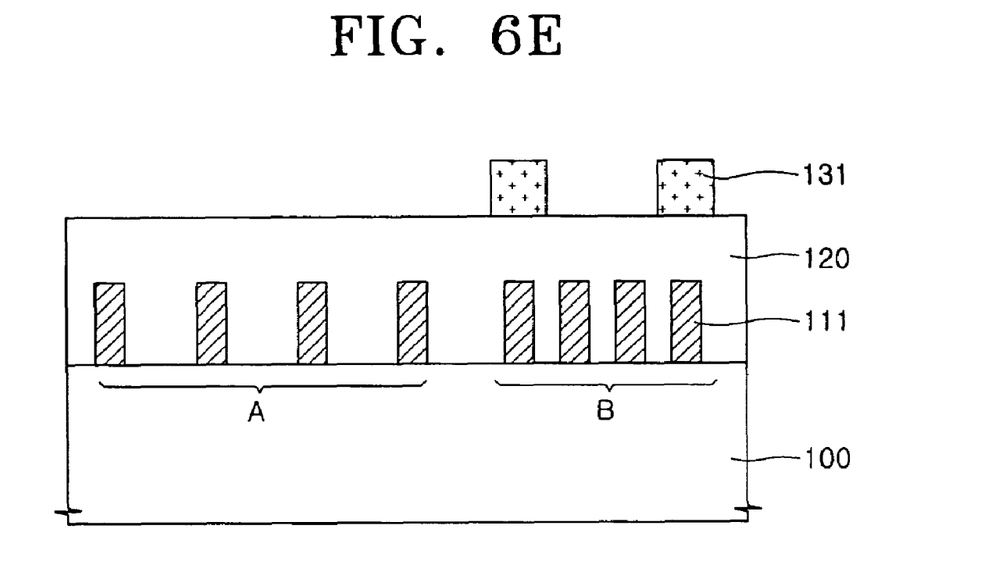

Referring to FIG. 6E, the second metal layer 130 is patterned using a photolithography and etching process so that a second metal layer pattern 131 is formed on the first insulation layer 120 in the bundle region B. The metal layer pattern 131 can be simultaneously formed with a second metal wire pattern (not illustrated).

Figure 6F:
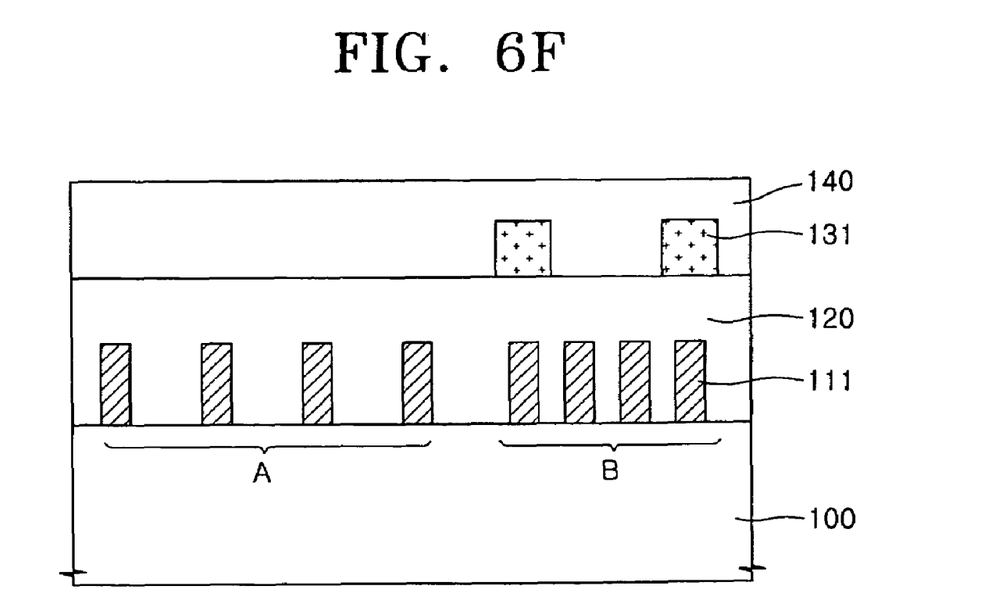

Referring to FIG. 6F, after forming the second metal layer pattern 131, a second insulation layer 140 is formed on the second metal layer pattern 131. In general, all metal wires in a semiconductor chip, for example, the first and second metal wires in the present embodiment, are formed, and then a test is performed to detect defective cells. In order to substitute a defective cell with a redundancy cell, a fuse box should be opened to open a fuse corresponding to the defective cell. That is, the fuse should be disconnected.

Figure 6G:
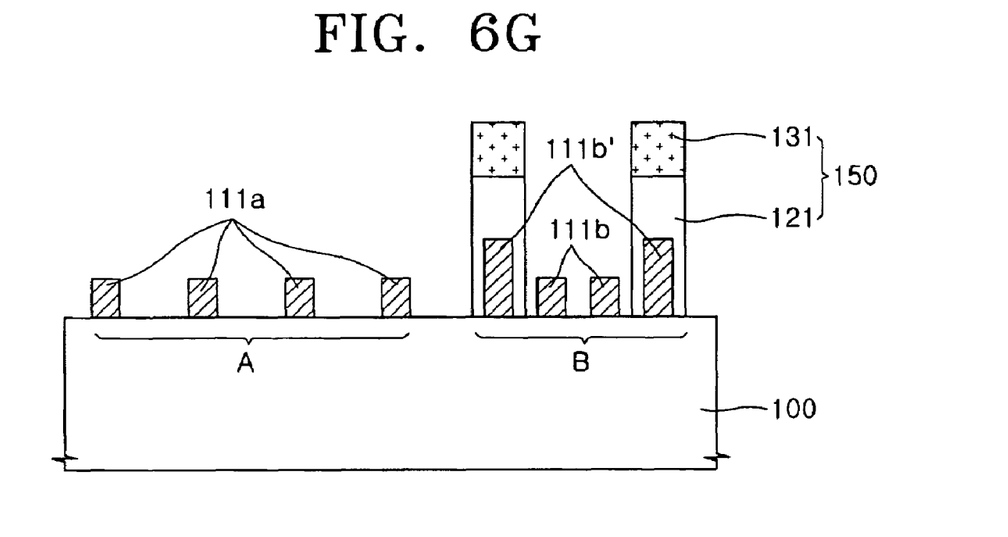

Referring to FIG. 6G, the first and second insulation layers 120 and 140 on the fuse box are etched to open the fuse box. The first and second insulation layers 120 and 140 are removed to expose the fuse pattern 111. When the first and second insulation layers 120 and 140 are etched, the second metal layer pattern 131 is used as a mask so that the second metal layer pattern 131 and the first insulation layer 121 under the second metal layer pattern 131 forms a capping layer 150 covering outermost fuses 111b' in the bundle region B.

The fuse pattern 111 is simultaneously formed with a first metal wire (not illustrated), and thus has the same height as the first metal wire. However, the height of the first metal wire is about 5000 Å. If a metal fuse having a height of 5000 Å is opened by laser blowing, high energy is required. High energy laser blowing can influence adjacent fuses, and thus the fuse interval in region A should be wide. However, the fuse interval decreases due to the high integration. Accordingly, in order to open a fuse using low energy laser blowing, the height of the fuse should be low. When the insulation layers 120 and 140 are removed to open the fuse box, the height of the fuses can be decreased by over-etching. That is, after the insulation layers 120 and 140 are removed, the fuse pattern 111 is etched continuously until the height of the fuse pattern 111 reaches the range of about 5000 Å to 2500 Å.

The capping layer 150 protects the fuses 111b' in the bundle region B from laser blowing.

In the present embodiment, a case when fuses are simultaneously formed with the first metal wire has been described. However, the fuse box and the method of manufacturing the same according to the present invention can be applied to any case when a conductive layer is formed, for example, a case when a bit line is formed.

Figure 7:
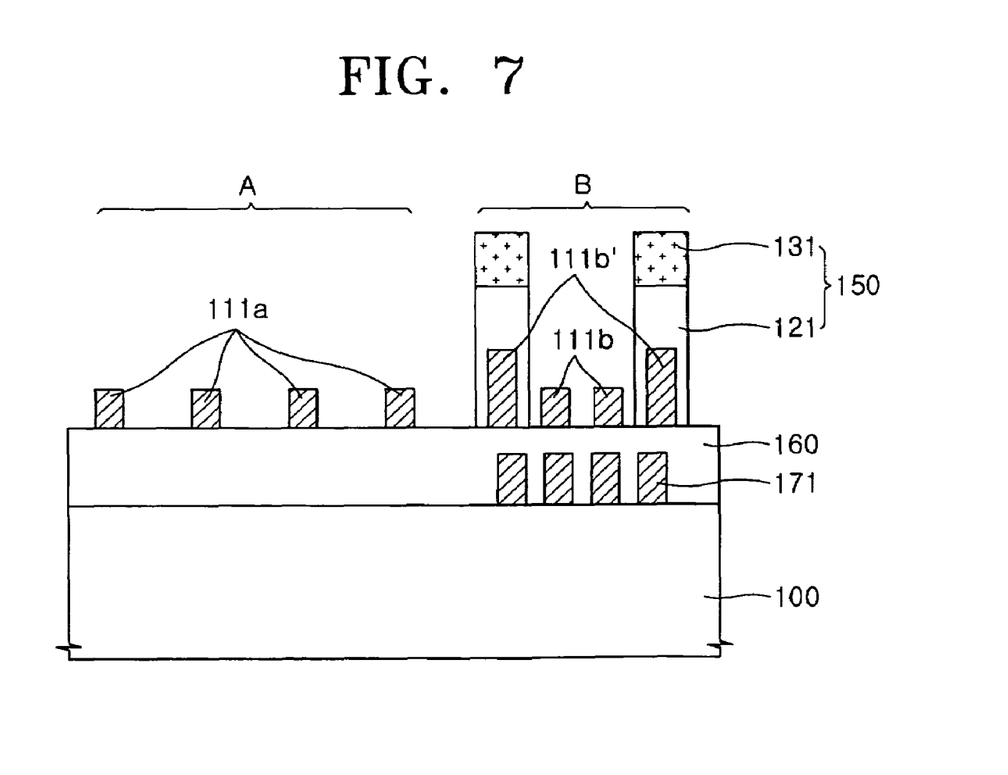
FIG. 7 is a cross-sectional view of an embodiment of fuses in a fuse box according to yet another aspect of the present invention.

FIG. 7 is a cross-sectional view of fuses in a fuse box according to another embodiment of the present disclosure. Referring to FIG. 7, the fuse box further includes fuses 171 disposed in a lower layer, such as an insulation layer 160. Fuses 111a, 111b and 111b' in an upper layer are the same as the fuses 111a, 111b and 111b' in FIG. 5. When fuses are formed in two layers, an additional space can be provided for the arrangement of the fuses, and thus the fuse interval can be wider. Accordingly, capacitive coupling decreases, thereby reducing the effects of cross talk. Here, the fuses 171 disposed in the lower layer are arranged in a bundle region B. When the fuses 171 are arranged in an open region A, the fuses 171 can be damaged by heat generated by laser blowing.

When a fuse box is formed of two layers, fuses disposed in a lower layer can be simultaneously formed with a first metal wire, fuses disposed in a upper layer can be simultaneously formed with a second metal wire, and a metal mask pattern disposed on a capping layer can be simultaneously formed with a third metal wire.

According to the present invention, a capping layer having a metal layer and an insulation layer covers outermost fuses among a plurality of fuses in a bundle region, which is adjacent to an open region, thereby reducing the influence of laser blowing of fuses in the open region, and preventing capacitive coupling caused by the formation of a parasitic capacitor between fuse lines and an insulation layer therebetween. Accordingly, cross talk due to the capacitive coupling can be prevented, thereby enhancing the reliability of a fuse circuit.

While the foregoing has described what are considered to be the best mode and/or other preferred embodiments of the present invention, it will be understood by those of ordinary skill in the art that various changes in form and details can be made therein without departing from the spirit and scope of the present invention as defined by the following claims. It is intended by the following claims to claim that which is literally described and all equivalents thereto, including all modifications and variations that fall within the scope of each claim.

What is claimed is:

1. A fuse box comprising:
   a first fuse region including a first plurality of fuse lines;
   a second fuse region adjacent to the first fuse region, the second fuse region including a second plurality of fuse lines, wherein a second fuse interval in the second fuse region is narrower than a first fuse interval in the first fuse region; and
   a capping layer, adjacent to the first fuse region, covering a top side and lateral sides of the entire of at least one outermost fuse lines from the second plurality of fuse lines in the second fuse region, while not covering at least one inner fuse in the second plurality of fuse lines.

2. The fuse box of claim 1, wherein the first plurality of fuse lines and the second plurality of fuse lines are formed of one of Al, Cu, and W.

3. The fuse box of claim 1, wherein the capping layer comprises:
   at least one insulation layer covering the top side and the lateral sides of the outermost fuse lines; and
   at least one metal layer disposed on top of the at least one insulation layer.

4. The fuse box of claim 3, wherein the at least one insulation layer has a low dielectric constant in the range of about 1.5 to 4.5.

5. The fuse box of claim 4, wherein the at least one insulation layer is formed of plasma enhanced tetraethyl orthosilicate (PE-TEOS).

6. The fuse box of claim 1, wherein the first fuse interval is in the range of about 1.5 to 2.5 μm.

7. The fuse box of claim 1, wherein the second fuse interval is in the range of about 0.2 to 0.7 μm.

8. The fuse box of claim 1, wherein heights of fuse lines not covered by the capping layer in the second fuse region is in the range of about 1500 to 3000 Å, and height of the outermost fuse lines in the second fuse region that is covered by the capping layer is in the range of about 4000 to 5000 Å.

9. The fuse box of claim 1, further comprising:
   a lower fuse pattern disposed in a layer having formed thereupon the first fuse region and the second fuse region.

10. The fuse box of claim 9, wherein the lower fuse pattern is disposed under the second fuse region.

* * * * *